(12) United States Patent
Phillips et al.

(10) Patent No.: US 7,193,474 B2
(45) Date of Patent: Mar. 20, 2007

(54) CURRENT LIMIT CIRCUIT FOR POWER AMPLIFIERS

(75) Inventors: Kerry B. Phillips, Cedar Rapids, IA (US); David S. Ripley, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 49 days.

(21) Appl. No.: 10/979,966

(22) Filed: Nov. 2, 2004

(65) Prior Publication Data

US 2006/0091960 A1 May 4, 2006

(51) Int. Cl.
*H03F 1/52* (2006.01)

(52) U.S. Cl. ..................................... 330/298
(58) Field of Classification Search ........ 330/296–298, 330/207 P, 285
See application file for complete search history.

(56) References Cited

U.S. PATENT DOCUMENTS 6,665,525 B2 * 12/2003 Dent et al. .................. 455/108
6,768,382 B1 * 7/2004 Shie et al. ................... 330/296
6,888,409 B1 * 5/2005 Taylor ......................... 330/297
6,897,730 B2 * 5/2005 Dupuis et al. .............. 330/297

* cited by examiner

*Primary Examiner*—Robert Pascal
*Assistant Examiner*—Hieu Nguyen
(74) *Attorney, Agent, or Firm*—Farjami & Farjami LLP

(57) ABSTRACT

According to one embodiment of the invention, a circuit arrangement includes a regulator circuit. The circuit arrangement further includes a current limit circuit coupled to the regulator circuit. The circuit arrangement further includes a power amplifier coupled to the regulator circuit, where the power amplifier is configured to draw a first current from the regular circuit. The current limit circuit is configured to decrease the first current when the first current causes a second current in the current limit circuit to be greater than a reference current. According to this embodiment, the second current is a mirror current of the first current. The current limit circuit includes a current sink, where the current sink is configured to sink the reference current to ground. The current limit circuit further includes a feedback loop, where the feedback loop causes the second current to be substantially equal to the reference current.

18 Claims, 2 Drawing Sheets

CURRENT LIMIT CIRCUIT FOR POWER AMPLIFIERS

BACKGROUND OF THE INVENTION

1. Field of the Invention

The present invention is generally in the field of semiconductor devices. More specifically, the present invention is in the field of semiconductor amplifiers.

2. Background Art

Power amplifiers, such as collector-voltage controlled power amplifiers, are used in a number of applications, including mobile telephones, for receiving and amplifying a radio frequency (RF) input signal and generating an RF output signal. The output power of a collector-voltage controlled power amplifier is basically set by fixing the voltage, such as VCC, on the collector of a power output transistor in one or more stages of the power amplifier. Since the output current drawn by the power amplifier is determined by VCC divided by the load impedance presented to the power amplifier by an output matching network, the output current is inversely proportional to the load impedance, which is assumed to remain constant under normal conditions. However, under adverse voltage standing wave ratio (VSWR) conditions, the load impedance presented to the power amplifier by the output matching network can significantly decrease, which can cause a corresponding undesirable increase in output current that can damage the power amplifier.

By way of background, VSWR can be defined as the ratio of the maximum radio-frequency (RF) voltage to the minimum RF voltage along a transmission line coupled to an antenna. In mobile telephones, the transmitter, including the power amplifier, matching network, and switcher/diplexor, may be specified to withstand a high VSWR at the antenna without damaging the circuitry. For example, a mobile telephone may be specified to withstand a VWSR of 20:1 at the antenna. Assuming an insertion loss of approximately 1.5 dB due to the matching network and switcher/diplexor, the VSWR at the output of the power amplifier may be reduced to approximately 4.5:1, which can cause the load impedance to be reduced by a factor of 4.5. As a result, the output current of the power amplifier can undesirably increase, which can drain the battery of the mobile telephone and damage the power amplification circuitry and the voltage regulatory circuit coupled to the power amplifier.

Thus, there is need in the art for a circuit that can prevent a decrease in load impedance at the output of a power amplifier, such as a collector-voltage controlled power amplifier, from causing an undesirable increase in current drawn by the power amplifier.

SUMMARY OF THE INVENTION

The present invention is directed to a current limit circuit for power amplifiers. The invention overcomes the need in the art for a circuit that can prevent a decrease in load impedance at the output of a power amplifier, such as a collector-voltage controlled power amplifier, from causing an undesirable increase in current drawn by the power amplifier.

According to one embodiment of the invention, a circuit arrangement includes a regulator circuit. The circuit arrangement further includes a current limit circuit coupled to the regulator circuit. The circuit arrangement further includes a power amplifier coupled to the regulator circuit, where the power amplifier is configured to draw a first current from the regular circuit. The first current can be a collector current of the power amplifier and the power amplifier can be a collector-voltage controlled power amplifier. The current limit circuit is configured to decrease the first current when the first current causes a second current in the current limit circuit to be greater than a reference current.

According to this embodiment, the second current is a mirror current of the first current. The current limit circuit includes a current sink, where the current sink is configured to sink the reference current to ground. The current limit circuit further includes a feedback loop, where the feedback loop causes the second current to be substantially equal to the reference current. The feedback loop can be coupled to a first transistor in the regulator circuit, where the first transistor controls the first current. The current limit circuit can include a second transistor, where the first transistor is coupled to the second transistor in a current mirror configuration. Other features and advantages of the present invention will become more readily apparent to those of ordinary skill in the art after reviewing the following detailed description and accompanying drawings.

DETAILED DESCRIPTION OF THE INVENTION

The present invention is directed to a current limit circuit for power amplifiers. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1:
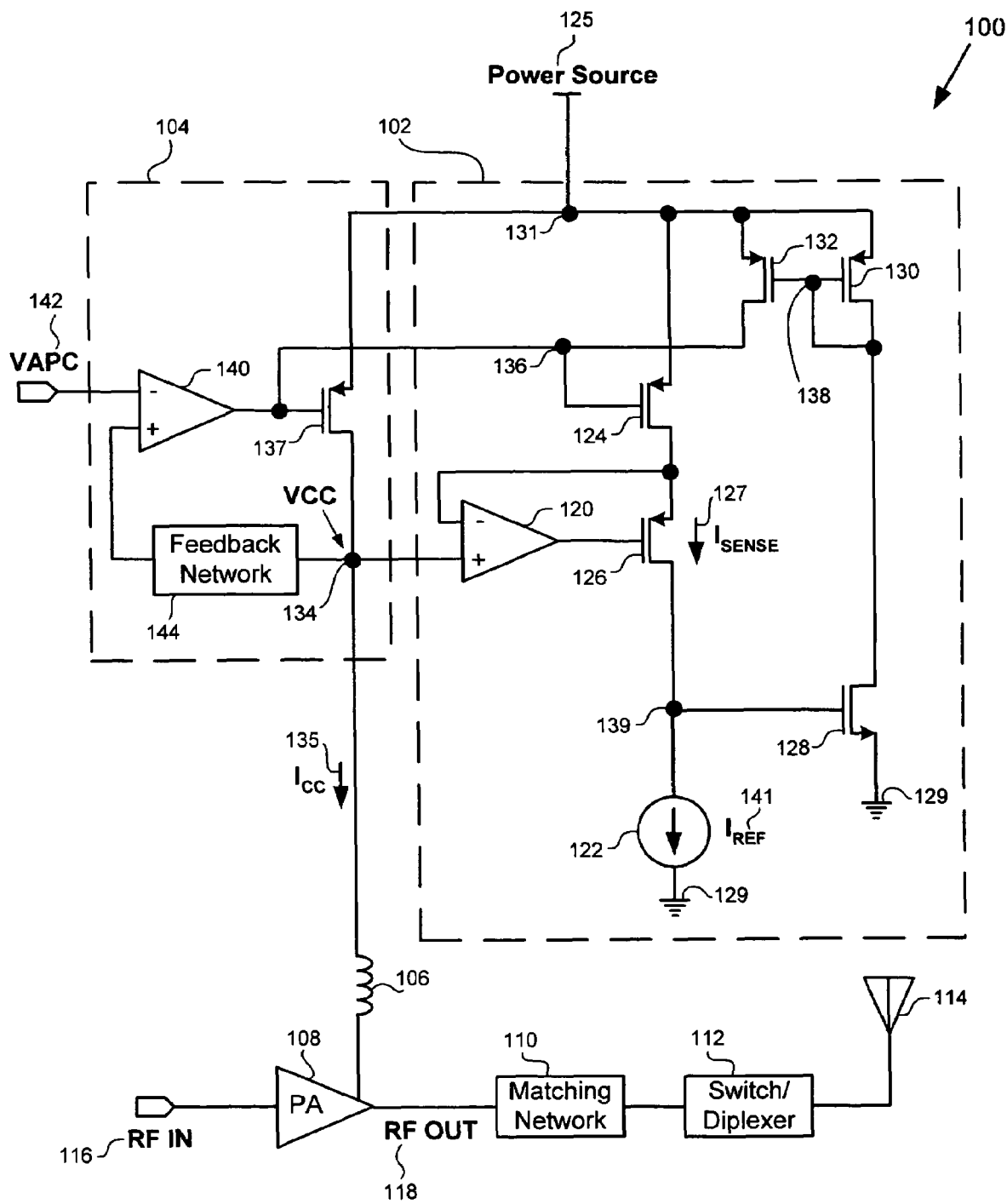
FIG. 1 is a schematic diagram illustrating an exemplary current limit circuit for a collector-voltage controlled power amplifier in accordance to one embodiment of the present invention.

FIG. 1 is a schematic diagram illustrating exemplary circuit arrangement 100. Circuit arrangement 100 comprises exemplary current limit circuit 102 according to one embodiment of the present invention. Circuit arrangement 100 includes current limit circuit 102, regulator circuit 104, inductor 106, power amplifier 108, matching network 110, switch/diplexer 112, and antenna 114. In circuit arrangement 100, current limit circuit 102 is coupled to regulator circuit 104, which is coupled to power amplifier 108. Current limit circuit 102 includes operational amplifier (op amp) 120, current sink 122, and transistors 124, 126, 128, 130, and 132. In the present embodiment, transistor 128 can be an n-channel field-effect transistor (NFET) and transistors 124, 126, 130, and 132 can be p-channel field-effect transistors (PFETs). In other embodiments, one or more of transistors 124, 126, 128, 130, and 132 can be other types of FETs or bipolar devices.

As shown in FIG. 1, the positive terminal of op amp 120 is coupled to regulator circuit 104 at node 134, which has a voltage referred to herein as "VCC". The negative terminal of op amp 120 is coupled to the drain terminal of transistor 124 and the source terminal of transistor 126. The gate terminal of transistor 124 is coupled to regulator circuit 104 at node 136 and the source terminal of transistor 124 is coupled to power source 125 at node 131. Power source 125 can comprise a DC power source, such as a battery. Also shown in FIG. 1, the gate terminals of transistors 130 and 132 and the drain terminal of transistor 130 are coupled to node 138 and the source terminals of transistors 130 and 132 are coupled to power source 125 at node 131. The drain terminal of transistor 132 is coupled to regulator circuit 104 at node 136.

Further shown in FIG. 1, the drain terminal of transistor 130 is coupled to the drain terminal of transistor 128 and the source terminal of transistor 128 is coupled to ground 129. The gate terminal of transistor 128 is coupled to the drain terminal of transistor 126 and a first terminal of current sink 122 at node 139. A second terminal of current sink 122 is coupled to ground 129. Current sink 122 can comprise an NFET, a current mirror, or other suitable device and can be configured to sink a maximum current ("$I_{REF}$") to ground 129.

Also shown in FIG. 1, the output of op amp 140 in regulator circuit 104 is coupled to the gate terminal of transistor 137 and the source terminal of transistor 137 is coupled to power source 125 at node 131. In the present embodiment, transistor 137 can be a PFET. In other embodiments, transistor 137 may be a different type of transistor. The size of transistor 137 is determined by the amount of current that transistor 137 is required to source in a particular application. For example, for a Global System for Mobile Communications (GSM) power amplifier operating at maximum power, transistor 137 must have a sufficiently large size to enable it, i.e. transistor 137, to source from approximately 1.5 amperes to approximately 2.0 amperes of current. The gate terminal of transistor 137 is coupled to the gate terminal of transistor 124 in a current mirror configuration; that is, during operation, $I_{CC}$ 135, which is the collector current of power amplifier 108 drawn through transistor 137, is directly proportional to $I_{SENSE}$ 127, which is the current drawn through transistor 124. The current mirror formed by transistors 137 and 124 have a mirror ratio equal to K, where K is determined by the size of transistor 137 with respect to the size of transistor 124. The value of K is bounded by a tradeoff between accuracy and efficiency, as a lower value of K will make $I_{SENSE}$ higher, and therefore more closely matched to $I_{CC}$, but will decrease efficiency of the power amplifier. A higher value of K will allow less current drain and higher efficiency, but will make the current limit circuitry more susceptible to non-idealities in the current mirror, and therefore less accurate.

Further shown in FIG. 1, the negative terminal of op amp 140 is coupled to VAPC 142, which is a standard signal that is used to control the output power of power amplifier 108. The positive terminal of op amp 140 is coupled to a first terminal of feedback network 144 and a second terminal of feedback network 144 is coupled to node 134. Feedback network 144 can be, for example, a resistive feedback network, which determines the gain of regulator circuit 104. In one embodiment, feedback network 144 can include frequency-shaping components. Also shown in FIG. 1, a first terminal of inductor 106 is coupled to regulator circuit 104 at node 134, i.e. VCC, and a second terminal of inductor 106 is coupled to power amplifier 108.

Further shown in FIG. 1, RF IN 116 is coupled to the input of power amplifier 108 and the output of power amplifier 108, i.e. RF OUT 118, is coupled to the input of matching network 110. Power amplifier 108 can be configured to receive and amplify RF IN 116 and generate RF OUT 118 and can also be configured to draw a collector current, i.e. $I_{CC}$ 135, from regulator circuit 104. Power amplifier 108 can be a collector-voltage controlled power amplifier, such as a collector-voltage controlled GSM power amplifier used in mobile telephones. However, it is contemplated that other types of power amplifiers can be used in accordance with various embodiments within the scope of the present invention, as those skilled in the art will appreciate. In one embodiment, power amplifier 108 can comprise a plurality of power amplifier stages. In one embodiment, power amplifier 108 can be a gallium arsenide (GaAs) power amplifier.

Also shown in FIG. 1, the output of matching network 110 is coupled to the input of switch/diplexer 112 and the output of switch/diplexer 112 is coupled to antenna 114. Matching network 110 can be configured to match the output impedance of power amplifier 108 to the impedance of switch/diplexer 112 and antenna 114. Switch/diplexer 112 can be configured to appropriately couple the output of matching network 110 to antenna 114, which can be a mobile telephone antenna.

The function and operation of current limit circuit 102 will now be discussed. Under normal operating conditions, $I_{SENSE}$ 127 is less than $I_{REF}$, which is the maximum current that current sink 122 can sink to ground 129. However, under adverse operating conditions, such as a higher than nominal VSWR at the output of power amplifier 108, the load impedance presented to power amplifier 108 by matching network 110 can decrease, which causes $I_{CC}$ 135, the collector current drawn by power amplifier 108, to increase. Since transistors 137 and 124 are coupled in a current mirror configuration, an increase in $I_{CC}$ 135 causes $I_{SENSE}$ 127 to increase. As $I_{CC}$ 135 continues to increase, $I_{SENSE}$ 127 becomes greater than $I_{REF}$ and, consequently, current sink 122 cannot sink any more current to ground 129. As a result, the voltage at node 139 increases, which turns on transistor 128.

When transistor 128 turns on, transistor 128 conducts current, which causes the voltage at node 138 to decrease. As the voltage at node 138 decreases, transistor 132 pulls up on node 136, which decreases the gate-to-source voltage of transistor 137. In other words, the current mirror formed by transistors 132 and 130 basically acts like a pull-up, and pulls up on node 136. The decrease in gate-to-source voltage of transistor 137 causes $I_{CC}$ 135 to decrease, which causes a corresponding decrease in $I_{SENSE}$ 127. As a result of the current mirror configuration of transistors 137 and 124 and the feedback loop formed by transistors 128, 130, and 132, $I_{CC}$ 135 continues to decrease until $I_{SENSE}$ 127 is substantially equal to $I_{REF}$. When $I_{SENSE}$ 127 is substantially equal to $I_{REF}$, $I_{CC}$ 135 is substantially equal to $K*I_{REF}$, where K is the mirror ratio of the current mirror comprising transistors 137 and 124.

Under normal operating conditions, where $I_{CC}$ 135 is less than $K*I_{REF}$, node 139 remains pulled down by current sink 122 such that transistor 128 does not conduct current and, consequently, the feedback loop discussed above does not operate. In order to avoid a severe reduction in efficiency, K, i.e. the mirror ratio of current mirror comprising transistors 137 and 124, is kept appropriately high to prevent $I_{SENSE}$ 127 from being too high. Any mismatch between transistors 137 and 124 is multiplied by K. One dominant source of mismatch between transistors 137 and 124 is the difference between the $V_{DS}$ (drain-to-source voltage) drops across the two transistors. In order to minimize this difference, op amp 120 and transistor 126 are used as a unity gain buffer to set the $V_{DS}$ of transistor 126 to be substantially equal to the $V_{DS}$ of transistor 137.

Thus, by utilizing a feedback loop, which includes 128, 130, and 132, in combination with a current mirror, which includes transistors 124 and 137, and current sink 122, the present invention's current limit circuit 102 effectively limits $I_{CC}$ 135, the collector current drawn by power amplifier 108.

Figure 2:
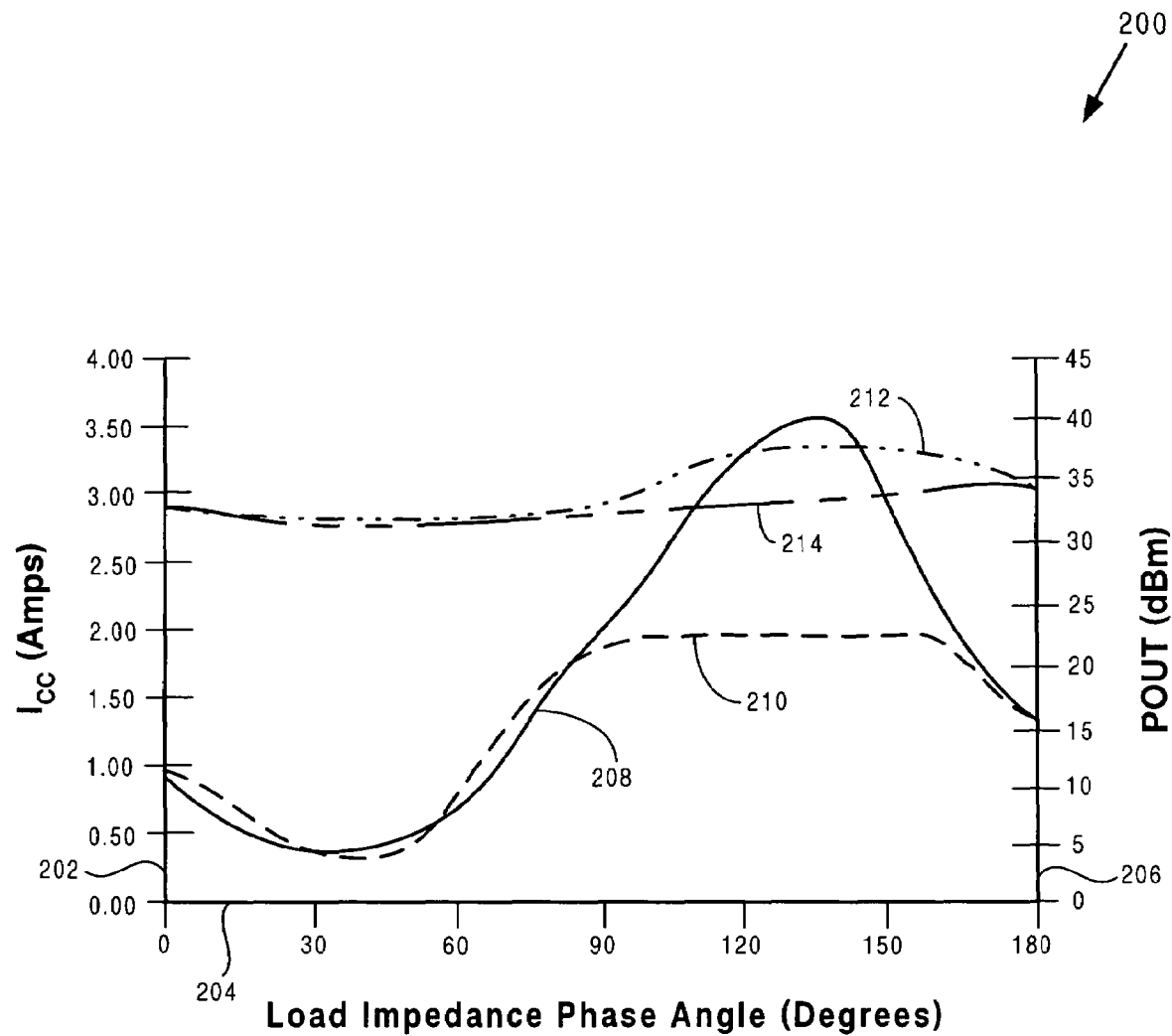
FIG. 2 is a graph showing exemplary collector current and power output curves of a power amplifier in accordance to one embodiment of the present invention.

FIG. 2 shows exemplary graph 200 including exemplary power output and collector current curves corresponding to a VSWR of 10:1 at the output of the matching network 110, in accordance with one embodiment of the present invention. Graph 200 includes collector current ($I_{CC}$) axis 202, load impedance phase angle (phase angle) axis 204, power output (POUT) axis 206, $I_{CC}$ curves 208 and 210, and POUT curves 214 and 216. In graph 200, $I_{CC}$ axis 202 corresponds to an exemplary current range of $I_{CC}$ 135 in FIG. 1, phase angle axis 204 corresponds to an exemplary phase angle range of a load impedance at the output of power amplifier 108 in FIG. 1, and POUT axis 206 corresponds to an exemplary power output range of power amplifier 108.

In graph 200, $I_{CC}$ curve 208 and POUT curve 212 correspond to respective collector current and power output of power amplifier 108 without current limit circuit 102 in FIG. 1 coupled to power amplifier 108, while $I_{CC}$ curve 210 and POUT curve 214 correspond to respective collector current and power output of power amplifier 108 with current limit circuit 102 coupled to power amplifier 108.

In the example shown in graph 200, $I_{CC}$ curve 210 is limited to a maximum collector current of approximately 1.9 amperes by current limit circuit 102, while $I_{CC}$ curve 208 has a maximum current of approximately 3.5 amperes. Also shown in the example in graph 200, POUT curve 214 has reduced output power variation compared to POUT curve 212. Thus, as shown in the example in graph 200, current limit circuit 102 limits the collector current of power amplifier 108 to a maximum current of approximately 1.9 amperes in contrast to a maximum current of approximately 3.5 amperes without current limit circuit 102 in operation. Furthermore, as shown in the example in graph 200, current limit circuit 102 also limits the output power variation of power amplifier 108. As a result, current limit circuit 102 allows power amplifier 108 to operate under tighter specifications under adverse VSWR conditions.

Thus, the present invention provides a current limit circuit that advantageously limits the collector current of a power amplifier, such as a collector-voltage controlled power amplifier. By providing a current limit circuit to limit the collector current of the power amplifier, the present invention advantageously protects the power amplifier and regulator circuit coupled to the power amplifier from damage caused by excessive collector current caused by reduced load impedance, which can occur under adverse VSWR conditions.

Additionally, the present invention's current limit circuit prevents excessive collector current in a power amplifier used in mobile telephone applications from rapidly draining battery charge, which advantageously extends talk time and minimizes the probability of disconnection during a telephone call. Furthermore, as discussed above, the present invention's current limit circuit also limits output power variations of the power amplifier caused by reduced load impedance, which advantageously allows the power amplifier to operate effectively under adverse VSWR conditions.

It is noted that although the present invention has been described with reference to collector-voltage controlled power amplifiers, such as GSM collector-voltage controlled power amplifiers, the present invention's current limit circuit may be used with other types of power amplifiers.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus a current limit circuit for power amplifiers has been described.

The invention claimed is:

1. A circuit arrangement comprising:
a regulator circuit;
a current limit circuit coupled to said regulator circuit;
a power amplifier coupled to said regulator circuit, said power amplifier being configured to draw a first current from said regulator circuit;
wherein said current limit circuit is configured to decrease said first current when said first current causes a second current in said current limit circuit to be greater than a reference current, wherein said second current is a mirror current of said first current, wherein said first current is a collector current of said power amplifier.

2. The circuit arrangement of claim 1 wherein said power amplifier is a collector-voltage controlled power amplifier.

3. The circuit arrangement of claim 1 wherein said current limit circuit comprises a current sink, said current sink being configured to sink said reference current to ground.

4. The circuit arrangement of claim 1 wherein said current limit circuit forms a feedback loop with said regulator circuit, wherein said feedback loop causes said collector current of said power amplifier to be reduced when said collector current causes said second current in said current limit circuit to be greater than said reference current.

5. The circuit arrangement of claim 4 wherein said feedback loop is coupled to a first transistor in said regulator circuit, said first transistor controlling said collector current.

6. The circuit arrangement of claim 5 wherein said current limit circuit comprises a second transistor, wherein said first transistor is coupled to said second transistor in a current mirror configuration.

7. The circuit arrangement of claim 3 wherein said reference current is a maximum current that can be sunk by said current sink.

8. The circuit arrangement of claim 5 wherein said regulator circuit comprises an operational amplifier, said operational amplifier driving said first transistor.

9. A current limit circuit for limiting a collector current to a power amplifier, said current limit circuit comprising:
a feedback loop formed between said current limit circuit and a regulator circuit;
a current sink configured to sink a reference current;

wherein said feedback loop causes said collector current to be reduced when said collector current causes a second current in said current limit circuit to be greater than said reference current.

10. The current limit circuit of claim 9 wherein said power amplifier is a collector-voltage controlled power amplifier.

11. The current limit circuit of claim 9 wherein said second current is a mirror current of said collector current.

12. The current limit circuit of claim 9 wherein said feedback loop causes said collector current to be reduced such that said second current is substantially equal to said reference current.

13. The current limit circuit of claim 9 wherein said feedback loop is coupled to a first transistor, said first transistor controlling said collector current.

14. The current limit circuit of claim 13 further comprising a second transistor, wherein second transistor is coupled to said first transistor in a current mirror configuration.

15. The current limit circuit of claim 13 wherein said first transistor is situated in said regulator circuit, said regulator circuit being coupled to said power amplifier.

16. The current limit circuit of claim 14 further comprising an operational amplifier, said operational amplifier causing a drain-to-source voltage of said first transistor to be substantially equal to a drain-to-source voltage of said second transistor.

17. A circuit arrangement comprising:
a regulator circuit;
a current limit circuit coupled to said regulator circuit;
a power amplifier coupled to said regulator circuit, said power amplifier being configured to draw a collector current from said regulator circuit;
wherein said current limit circuit is configured to decrease said collector current when said collector current causes a second current in said current limit circuit to be greater than a reference current, wherein a feedback loop is formed between said current limit circuit and said regulator circuit, wherein said feedback loop causes said second current to be substantially equal to said reference current.

18. The circuit arrangement of claim 17 wherein said feedback loop is coupled to a first transistor in said regulator circuit, said first transistor controlling said collector current.

* * * * *